Jan. 10, 1967 R. D. SPIERS 3,297,442

METHOD OF MANUFACTURE OF CIRCUIT BOARDS

Filed April 30, 1964

INVENTOR

ROBERT D. SPIERS

BY Roy E. Raney

ATTORNEY

United States Patent Office 3,297,442
Patented Jan. 10, 1967

3,297,442
METHOD OF MANUFACTURE OF CIRCUIT BOARDS

Robert D. Spiers, Treasure Island, Fla., assignor to General Components Incorporated, St. Petersburg, Fla., a corporation of Florida Filed Apr. 30, 1964, Ser. No. 363,701
1 Claim. (Cl. 96—36.2)

This invention relates to the manufacture of printed circuit boards, and more particularly to improvements in methods of manufacturing printed circuit boards of the type comprising an insulating base or panel supporting an electrical circuit formed of a thin layer of a conductive metal, such as copper, having a corrosion resistant covering, such as gold plating, to protect the circuit from oxidation or the like.

In manufacturing circuit boards of the type referred to, heretofore it has been the practice to form the circuit pattern and then apply the covering or plating of gold to the entire circuit pattern including those areas known as "soldering pads" to which the leads of electrical components, such as resistors, transistors, or the like, are to be soldered. Because the gold tends to form an amalgum with the solder and is therefore deleterious to the quality of the solder connections, it has been necessary to remove the gold plating from the pads prior to soldering the electrical components leads thereto. This has been accomplished by abrasively erasing the gold plating from the surface of the soldering pads which is a laborious, time consuming, and hence expensive method of eliminating the gold and one which results in a large number of rejects because of inadvertent damage to the plating or other portions of the circuitry.

It is a primary object of this invention to provide an improved method of manufacturing circuit boards of the type having a corrosion resistant covering, such as gold plating, precisely deposited only on the conductor areas of the circuit so that the solder pad areas remain uncovered and the soldering connections are free of gold contamination.

Another object of this invention is the provision of a method of producing a circuit board having a conductive metal circuit of which only predetermined areas are covered with an oxidation resistant metal and other areas of which are exposed for soldering, and which methods can be carried out with presently existing printed circuit board manufacturing materials such as masking agents known as "resist" which may be applied or "printed" photographically or by other printing procedures such as silk screen, offset, or the like.

More specifically an object of this invention is to provide an improved method of manufacture of circuit boards of the foregoing character comprising the steps of providing on a first web a delineation of the complete electric circuit pattern desired to be produced on the completed circuit board, providing an insulating base or panel having an etchable thin metallic sheet or facing such as copper, modifying the circuit delineation on the web to eliminate segments of the circuit which are not to be covered, preparing a printing element to print the modified circuit on the metallic sheet by printing a masking material on the metallic facing to shield the metal from plating deposits thereon except in exposed areas delineating the unmodified segments of the circuit pattern, coating these exposed predetermined areas with a corrosion resistant material as by gold plating, removing the masking material completely from the metal sheet, utilizing a printing element having the complete circuit delineated on a surface thereof to apply an etching resistant masking material to the sheet in the form of the completed circuit with segments thereof corresponding to the plated segments in registration therewith, and etching the metallic sheet to remove all metal but that covered by the masking material to provide a circuit having only the predetermined areas thereof coated with the corrosion resistant plating.

A still more specific object of the invention is the provision of a method of forming a panel having an electric circuit pattern thereon having only certain predetermined areas plated, comprising the steps of delineating the complete desired circuit on a delineating element, altering the delineating thereon by removing the portions delineating the parts to be unplated, forming a printing element to delineate by printing the altered circuit pattern on a thin sheet of conductor supported on an insulating base by surrounding the outline of the altered circuit by a masking material capable of shielding the conductor sheet from plating applied to said sheet at the areas surrounding the segments of the delineated circuit, subjecting the conductor sheet to a plating process, removing the masking material, then utilizing a printing element having the delineation of the complete circuit pattern to apply by printing an etching solution resisting coating to the conductor sheet in the form of the complete circuit desired and having the respective segments of the delineated circuit in registration with the corresponding plated circuit segments on the sheet, submitting the conductor sheet to the action of a dissolving acid, and then removing the acid resisting coating from the sheet.

Other objects and advantages of the present invention will become apparent from the following detailed description of a preferred method of manufacturing circuit boards according to the invention, the specification being read in conjunction with the accompanying sheet of drawings forming a part hereof, and in which.

Figures 1, 2, 3, 4, 5, 6, 7, 8:
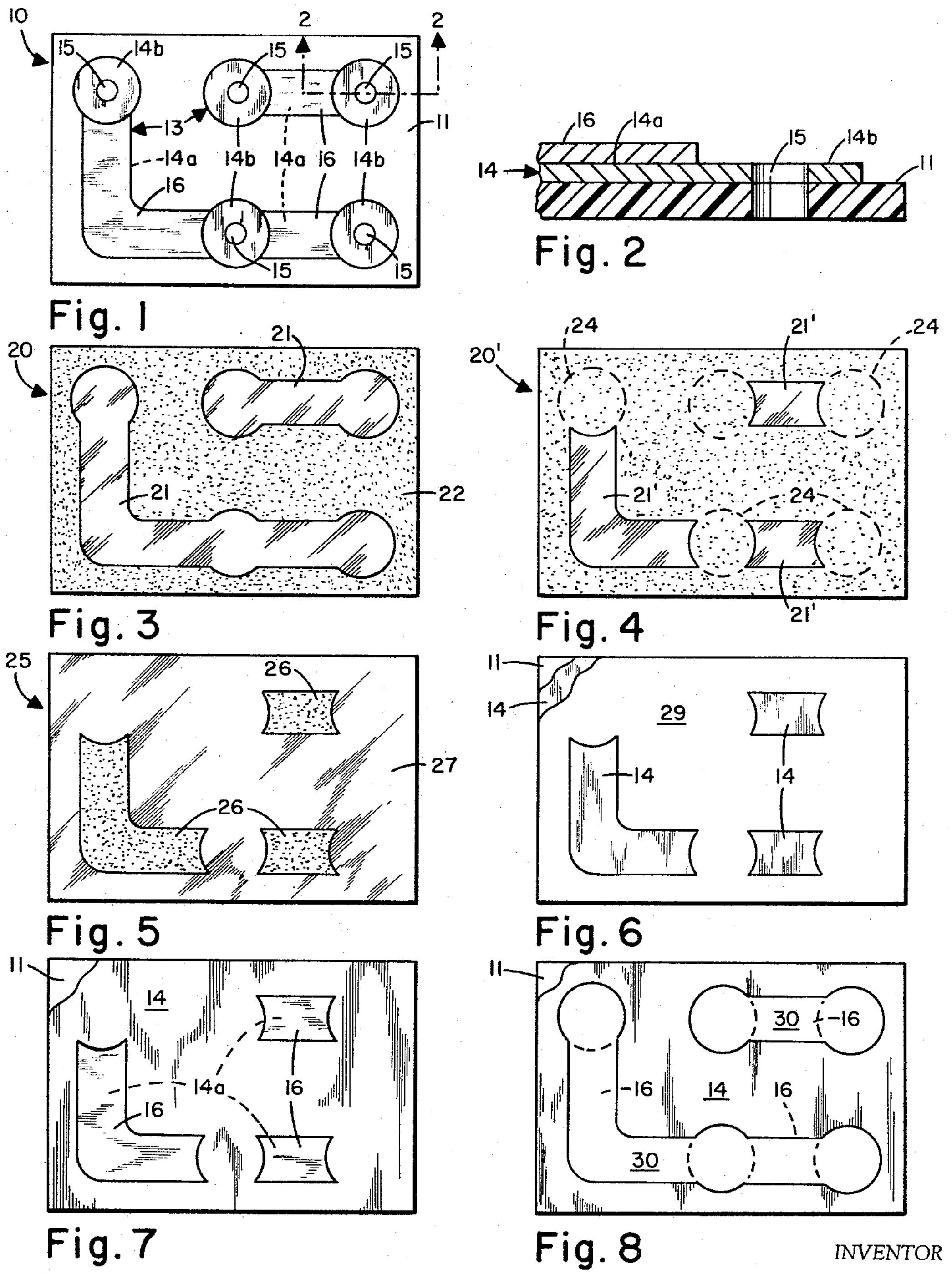
FIG. 1 is a plan elevational view of a segment of printed circuit board manufactured by a method embodying the invention, certain parts being shown exaggerated.
FIG. 2 is a sectional view taken substantially along line 2—2 of FIG. 1.
FIG. 3 is a plan view of a negative printing element.
FIG. 4 is a plan view of a modified negative printing element.
FIG. 5 is a plan view of a positive printing element.
FIG. 6 is a plan view of a circuit board illustrating one step of the method of this invention.
FIG. 7 is a plan view of the circuit board after another step of the method.
FIG. 8 is a plan view of the circuit board illustrating still another step of the method.

Referring now to FIGS. 1 and 2, illustrating a printed circuit board 10 manufactured by a method embodying this invention, the board 10 comprises an insulating base 11 in the form of a panel of a suitable phenolic resin material such as "Bakelite." Electrical circuit segments 13 are supported by the insulating base 11 and comprises a pattern formed of a thin sheet or layer of conductive metal, such as a copper facing 14, having conductor portions **14*a* and soldering pad portions 14*b*, referred to hereinafter merely as soldering pads. The soldering pads 14*b* and insulating base 11 are apertured as at 15 to receive the wire leads of electronic components (not shown) such as resistors, tansistors, or the like to be soldered to the circuit segments in a manner which is well understood by those skilled in the art to which the invention pertains and need not be further described herein. The conductor portions 14*a* of the circuit are covered with a corrosion resistant material such as gold plating 16 which terminates at the edge of each of the soldering pads 14***b*.

The method of forming the circuit pattern is carried out by suitably securing a thin copper film or facing 14 to the insulating base 11 so that the facing can be ultimately etched away in all areas except those corresponding to the desired circuit pattern.

Next, a complete desired circuit is delineated on a printing element in the form of a negative photographic film 20. This negative is preferably provided by photographing a black-on-white inked drawing of the desired circuit pattern so that the circuit is delineated by clear portions of the otherwise opaque film, as may be seen in FIG. 3, wherein the negative film 20 has transparent portions or segments 21 and the opaque area 22. Preferably duplicate negative films are made at one time.

One of the negative films 20 is then modified by applying opaquing material to the film in the areas 24 indicated by dotted lines and corresponding to the soldering pad areas 14*b* of the desired circuit so that the circuit segments now delineated on the negative are those segments to be plated, i.e. segments 14*a*, as is illustrated in FIG. 4.

The modified negative 20' is then employed to produce a positive printing element or film 25 by the usual photographic process and on the positive film the opaque areas 26 are on a transparent field 27 and correspond in configuration and spacing to those segments 14*a* of the circuit which are to be covered by the gold plating. The solder pads will not be delineated, as may be seen by reference to FIG. 5.

The positive film 25 is then used to print a masking agent on the copper facing 14 excepting on the areas corresponding to the segments 14*a* of the circuit, these segments being exposed to receive a plating of gold. The masking agent is a substance which shields the conductor from deposits of gold and can be readily removed. This printing is accomplished by first coating the entire copper facing 14 with a light sensitive masking material such as "Kodak Photo-resist" which is affected by exposure to light in the same manner as the usual photographic film emulsion and the exposed portion may then be dissolved by the usual photographic development process. The film 25 is then laid over the coated copper facing and exposed to light. The panel 11 and its facing 14 are then subjected to the usual photographic film developing process which removes only the portions of the "resist" which were subjected to light through the positive film 25, namely areas 14*a*, as shown in FIG. 6. These exposed areas of the copper facing 14 are then gold plated by the usual electro-plating process during which process the areas covered by the masking layer 29 are unplated as they are shielded from the plating action by the masking material. The layer 29 of masking material is then removed or stripped by washing with a suitable photographic emulsion dissolver to reveal the copper facing 14 on the panel 11 with the desired pattern of gold plating 16 overlying the segments 14*a* as shown in FIG. 7.

The copper facing 14 is then entirely covered with a coating of "Photo-resist" and the duplicate unaltered negative 20 is placed over the facing in exactly the same relationship to the facing as was negative 20' and then exposed to light, after which the coating is developed by the usual photographic process which results in a printed coating 30 of emulsion and on the facing 14 delineating the complete circuit pattern, as is illustrated in FIG. 8.

The panel 11 is then placed in an etching solution which dissolves the uncovered areas of facing 14 and does not affect the coated segments 30. The coating 30 is then removed by washing in a suitable photographic emulsion solvent to reveal the complete circuit 13 in the form shown in FIG. 1 in which conductor portions 14*a* are covered by gold plating 16 and soldering pads 14*b* are uncovered. Thereafter the apertures 15 in the pads 14*b* may be conveniently formed as by drilling or the like.

From the foregoing detailed description of a preferred circuit board manufacturing method embodying the present invention it will be recognized that the invention accurately places the gold plating or other corrosion resistant material only in those areas where it is required, thereby eliminating tedious, time consuming and expensive labor in the removal of such material from areas where its presence adversely affects the subsequent use of the boards. Furthermore, the invention could be practiced by printing elements other than photographic films, for example, silk screen, or other suitable processes or combinations of processes could be employed to deposit masking material on the precise circuit segments in the order described. It will be seen that the practice of this invention results in reduction of rejects by precluding accidental damage by erasing procedures, and results in better, more reliable circuit boards in that the soldering pads are unscuffed and of full thickness.

Although the invention has been described in considerable detail with reference to a preferred process embodying the invention it will be understood that the invention is not limited thereby, but rather includes all those modifications, substitutions, and uses as are reasonably embraced by the scope of the claim hereof.

Having described my invention, I claim:

A method of producing a circuit board having a conductive circuit of a given pattern of such soldering pad areas thereof are uncovered and segments interconnecting pad areas are covered with a protective metal plating, comprising the steps of providing a surface having the complete circuit delineated thereon, reproducing from said delineated circuit a photographic negative film of an exact delineation of said circuit, wherein the circuit is delineated by the transparent portions of said negative film, opaquing said pad areas appearing on said negative film to provide a modified circuit delineation, providing a positive photographic film from said modified negative film, providing a panel of electrical insulating material having a sheet of copper attached to one face thereof and having an area greater than the area of said given pattern, coating said one face with a photosensitive emulsion, photographically printing the modified circuit on said coated face by exposing said face to asid positive film, electro-plating the resultant uncovered areas of said sheet of copper with a gold deposit, removing said coating material, providing a negative photographic film of an exact delineation of said entire given circuit pattern thereon by clear areas on an opaque background, applying a coating of photographic emulsion over said face, placing the second mentioned negative film relative to said coated face to cause said interconnecting segments of said given circuit thereon to coincide with the plated segments on said sheet and photographically printing said complete circuit on said coated sheet, subjecting said sheet to an etching bath to remove the exposed portions of said sheet, and then removing said emulsion coating.

References Cited by the Examiner

UNITED STATES PATENTS 3,169,063 2/1965 Johnston et al. ________ 96—35

A. WYMAN, *Primary Examiner.*

JACOB STEINBERG, *Examiner.*